(12) United States Patent
LeReverend et al.

(10) Patent No.: US 6,697,000 B2
(45) Date of Patent: Feb. 24, 2004

(54) DELTA-SIGMA MODULATOR WITH FEED-FORWARD PATH

(75) Inventors: Remi LeReverend, San Diego, CA (US); Guy Delight, Escondido, CA (US)

(73) Assignee: Zarlink Semiconductor (U.S.) Inc., San Diego, CA (US)

( * ) Notice: Subject to any disclaimer, the term of this patent is extended or adjusted under 35 U.S.C. 154(b) by 0 days.

(21) Appl. No.: 10/212,474

(22) Filed: Aug. 2, 2002

(65) Prior Publication Data

US 2003/0169193 A1 Sep. 11, 2003

Related U.S. Application Data

(63) Continuation-in-part of application No. 10/095,304, filed on Mar. 8, 2002, now abandoned
(60) Provisional application No. 60/393,983, filed on Jul. 3, 2002.

(51) Int. Cl.[7] .................................................. H03M 3/00
(52) U.S. Cl. ........................................ 341/143; 341/144
(58) Field of Search ................................ 341/143, 144, 341/155; 375/269; 708/313

(56) References Cited

U.S. PATENT DOCUMENTS

| | | | | |
|---|---|---|---|---|
| 4,772,871 A | | 9/1988 | Suzuki et al. ................ | 341/155 |
| 5,012,244 A | * | 4/1991 | Wellard et al. .............. | 341/143 |
| 5,648,779 A | * | 7/1997 | Cabler .......................... | 341/143 |
| 5,729,483 A | * | 3/1998 | Brown ......................... | 708/313 |
| 5,757,300 A | * | 5/1998 | Koilpillai et al. ........... | 341/143 |
| 5,818,374 A | * | 10/1998 | Tan .............................. | 341/143 |
| 6,005,505 A | * | 12/1999 | Linz ............................. | 341/143 |
| 6,249,236 B1 | * | 6/2001 | Lee et al. .................... | 341/143 |
| 6,317,468 B1 | * | 11/2001 | Meyer ......................... | 375/269 |
| 6,323,794 B1 | * | 11/2001 | Okuda et al. ................ | 341/143 |
| 6,424,279 B1 | * | 7/2002 | Kim et al. ................... | 341/143 |

OTHER PUBLICATIONS

Ritoniemi et al., "A Stereo Audion Sigma Delta ADC" (Dec. 1994), IEEE Journal of Solid State Circuits, vol. 29, No. 19.*
Medeiro, "Automatic Design Of Delta Modulators Form Specificaitons To Silicon" Jul. 6–8, 1994, IEEE, pp. 96–101.*
Coban et al., "A 1.5V 1.0mW Audio ΔΣ Modulator with 98dB Dynamic Range", (1999) IEEE International Solid–State Circuits Conference.
Coban et al., "A New Fourth–Order Single–Loop Delta–Sigma Modulator for Audio Applications", (1996) IEEE p. 461–464.
Naiknaware et al., "Power Optimization of ΔΣ Analog–to–Digital Converters Based on Slewing and Partial Settling Considerations" (1998) IEEE pp. 360–364.
Norsworthy et al., "Delta–Sigma Data Converters", (1997), IEEE Press, Section 11.

* cited by examiner

*Primary Examiner*—Jean Jeanglaude
(74) *Attorney, Agent, or Firm*—Knobbe Martens Olson & Bear LLP (57) ABSTRACT

A delta-sigma modulator comprising a number of integration stages and having a feed-forward path from a signal input section to the signal path prior to a final integration stage, so as to reduce processing in the majority of integration stages to error processing. A delta-sigma modulator with acceptable dynamic range and incomplete settling can be designed for audio applications using a ratio of gain bandwidth product to sampling frequency in terms of a resolution of the converter. Satisfying the criteria provided by the ratio reduces the gain bandwidth requirement below that previously used as acceptable values in data converter design.

20 Claims, 7 Drawing Sheets

DELTA-SIGMA MODULATOR WITH FEED-FORWARD PATH

CROSS REFERENCE TO RELATED APPLICATIONS

This application is a continuation-in-part of U.S. patent application Ser. No. 10/095,304 entitled "DELTA-SIGMA MODULATOR WITH FEED-FORWARD PATH" filed on Mar. 8, 2002 now abandoned. The disclosure of the above-described filed application is hereby incorporated by reference in its entirety.

This application claims priority to U.S. Provisional Patent Application 60/393,983 entitled "DELTA SIGMA MODULATOR" and filed on Jul. 3, 2002.

BACKGROUND OF THE INVENTION

1. Field of the Invention

The present invention relates to data converters, and more particularly to delta sigma modulators.

2. Description of the Related Art

Analog to digital conversion is widely used in many circuit applications. Such application environments include hearing aids, cellular telephones, and other circuits which require conversion of audio information into a digital form. The single-loop higher order delta-sigma modulator based analog to digital converter (ADC) has recently found a significant application area in audio circuits such as these. Delta-sigma modulators combine the quantization noise reduction and eased analog circuitry benefits of oversampling ADC's with the benefit of noise shaping to achieve a high resolution ADC.

Increased accuracy in ADC's is continuously sought after so as to improve the performance of the circuit wherein the ADC is utilized. In addition to improved accuracy and resolution, power consumption in battery powered devices implementing a delta-sigma converter can be of significant concern.

SUMMARY OF THE INVENTION

A delta-sigma modulator employing a single loop, fourth order architecture comprises an input signal section, an output signal section, four integration stages connected in a cascaded configuration and having a signal path, at least one feedback path from the output signal section, and a feed-forward path, connected to the input signal section and to the signal path prior to a fourth integration stage. The feed-forward path includes a differentiator, which is connected to the signal path prior to the fourth integration stage. The delta-sigma modulator can be implemented in, for example, an analog to digital converter.

In one embodiment, at least one of the integration stages has a ratio of gain bandwidth product to sampling frequency of less than about 0.2 times a resolution of the delta-sigma modulator.

A method of improving error processing in a fourth order delta-sigma modulator having four integration stages comprises connecting an input signal feed-forward path to the signal path prior to a fourth integration stage. The method further comprises differentiating an input signal along the feed-forward path.

A fourth order delta-sigma modulator, for use in an analog to digital converter, comprises an input signal section, an output signal section, a plurality of integration stages connected in a cascaded configuration, a feed-forward path coupled to the input signal section and connected to the signal path prior to a last of the plurality of integration stages. The feed-forward path includes a differentiator.

According to another aspect of the invention, an audio circuit comprises a fourth order delta-sigma modulator having a feed-forward path connected from an input signal section to the signal path prior to a final integration stage. In one embodiment of the audio circuit, the feed-forward path includes a differentiator. In another embodiment, wherein the modulator comprises a plurality of integrators, at least one of the integrators has a ratio of gain bandwidth product to sampling frequency of less than about 0.2 times a resolution of the modulator.

DETAILED DESCRIPTION OF THE PREFERRED EMBODIMENT

Embodiments of the invention will now be described with reference to the accompanying Figures, wherein like numerals refer to like elements throughout. The terminology used in the description presented herein is not intended to be interpreted in any limited or restrictive manner, simply because it is being utilized in conjunction with a detailed description of certain specific embodiments of the invention. Furthermore, embodiments of the invention may include several novel features, no single one of which is solely responsible for its desirable attributes or which is essential to practicing the inventions herein described.

Figure 1A:
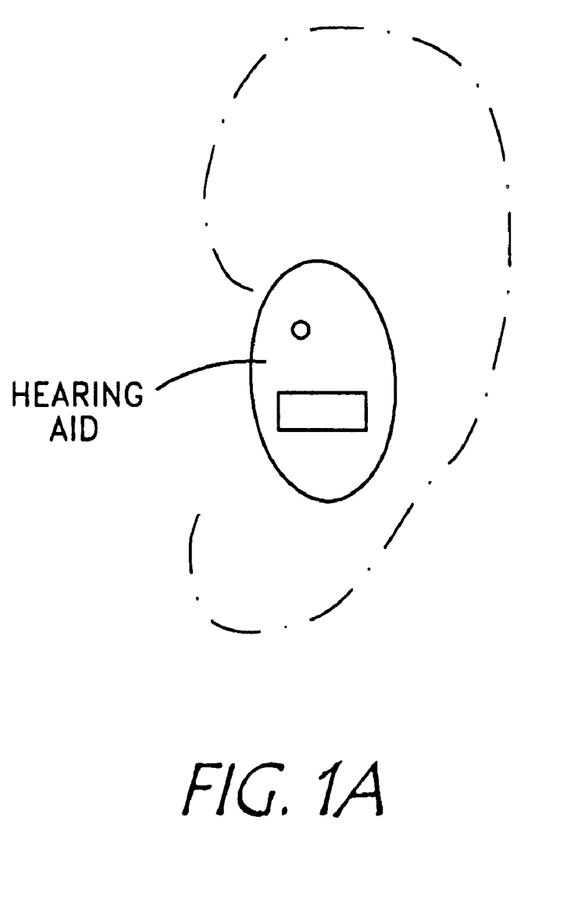
FIG. 1A is an exemplary illustration of a hearing aid.
Figure 1B:
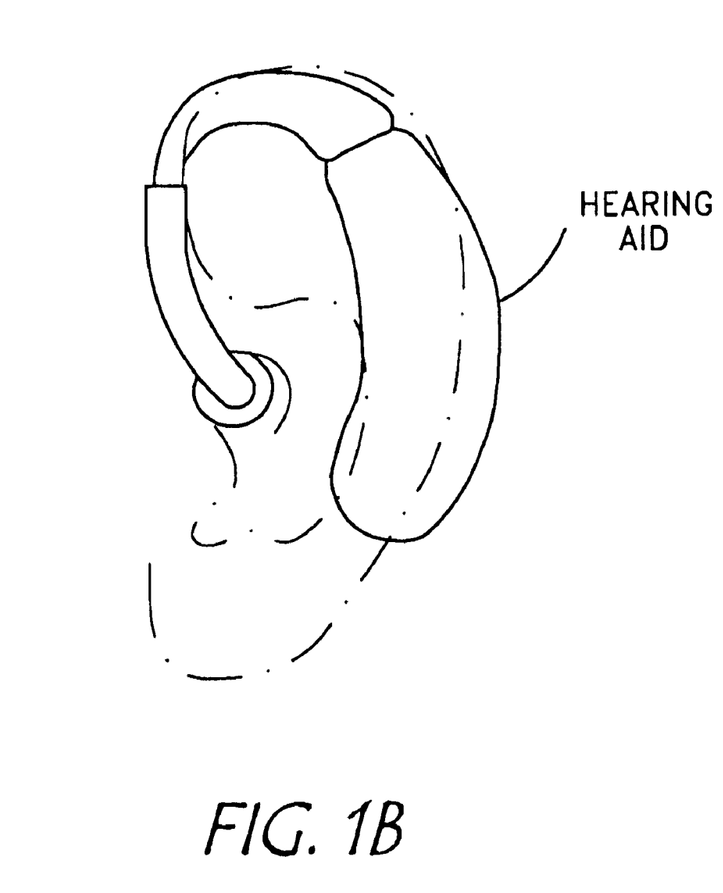
FIG. 1B is an exemplary illustration of a hearing aid.

Small audio devices, such as the hearing aids shown in FIGS. 1A–1B, typically operate on battery power. Replacing the small sized batteries that power such devices can be cumbersome for the user, in addition to costly if power consumption is high. Similarly, a high rate of power consumption is also of concern for cellular telephones operating on battery power, where the batteries are typically rechargeable. For cellular telephones operating on power from a rechargeable battery, high power consumption can lead to reduced operation time of the device between recharging periods, thereby limiting device use time and inconveniencing the user.

Figure 2:
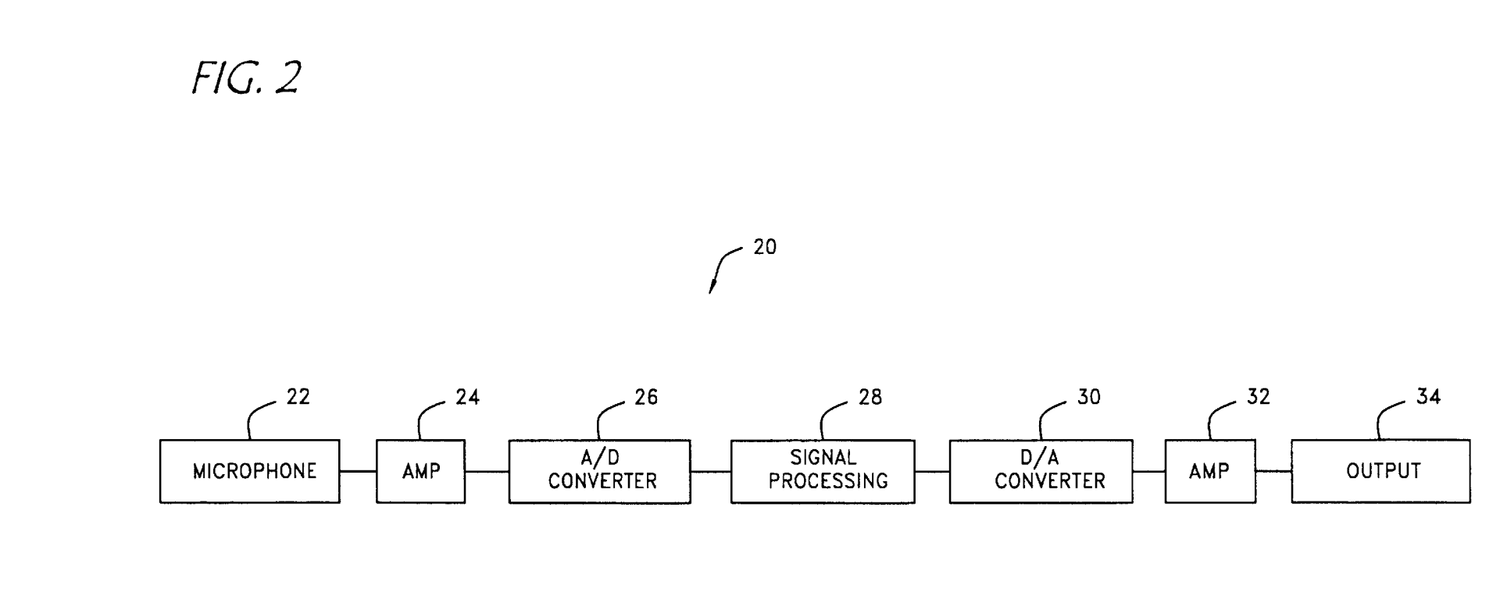
FIG. 2 is a block diagram of an exemplary audio circuit.

For devices having digital capabilities, such as digital hearing aids and digital cellular telephones, an audio circuit such as the circuit 20 illustrated in FIG. 2 is commonly used. The audio circuit 20 comprises a microphone 22, an input amplifier 24, an analog-to-digital converter 26, a signal processing section 28, a digital-to-analog converter 30, an output amplifier 32, and an output signal section 34, connected in series. The data converters 26, 30 can be used to convert data from analog form to digital form for digital signal processing, and digital form to analog form for an analog signal output. A large amount of power consumption typically occurs in a data converter portion of the device, therefore, implementing a low power data converter in battery powered devices which use an audio circuit such as the circuit 20 would prolong battery life.

Integrated circuits have recently moved to a low voltage, low power (LV/LP) implementation. Delta-sigma modulators have therefore been modified for these environments wherein the use of LV/LP operational amplifiers (op amp) in the modulator has become significant. The use of a delta-sigma modulator can reduce the strict LV/LP op amp requirements to apply to just the first stage of the modulator. Therefore, due to the reduced requirements on the op-amps of the modulator, power dissipation can be reduced by selecting components with parameters conducive to low power dissipation. Additionally, the order of the loop filter can be increased such that a steeper noise shaping filter can be realized.

General requirements for a low-voltage modulator typically include a large input range and low integrator output swings. A large input range is important because the input range is reduced as the supply voltage is lowered, which indicates large capacitor sizes for the first integrator in order to lower noise. However, smaller thermal noise limited sampling capacitors can be used in the first integrator if the input range can be increased with respect to the supply voltage, thereby reducing op amp power dissipation. Additionally significant are reduced integrator output swings, which can result in lower signal distortion. To reduce integrator output swings, a topology can be chosen for the modulator wherein the integrators have low swings at the expense of large gain coefficients.

The accuracy of converting an analog signal received at the microphone 22 to a digital signal for signal processing in the signal processing block 28 is important such that an accurate sampling of the analog input signal is used for processing and output of the circuit 20. The ADC 26 can therefore be implemented with a delta-sigma modulator of the invention to increase accuracy of analog-to-digital conversion and improve error processing in the circuit 20.

Figure 3:
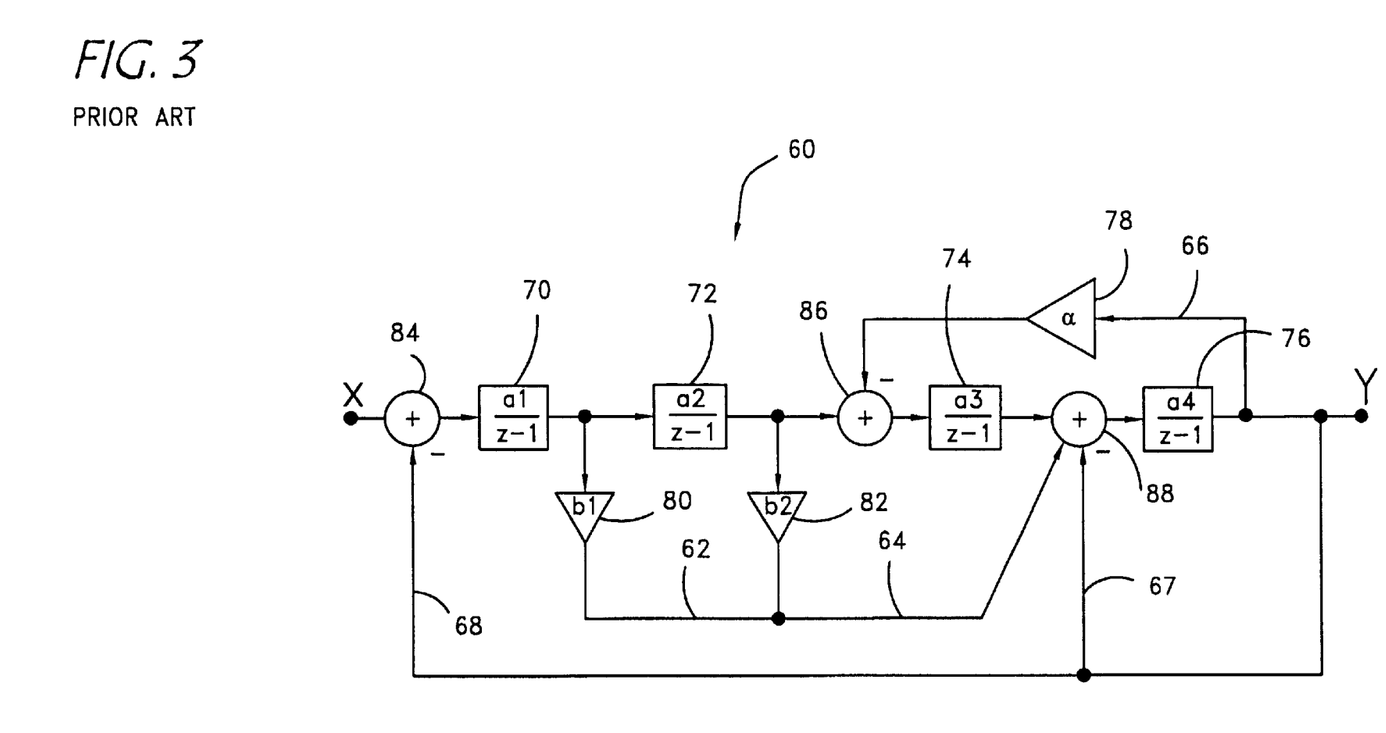
FIG. 3 is a block diagram of a delta-sigma modulator of the prior art.

An exemplary fourth-order single-loop delta-sigma modulator is disclosed by Coban in his 1996 IEEE article "A New Fourth-Order Single-Loop Delta-Sigma Modulator for Audio Applications," hereby incorporated by reference in its entirety. Coban's modulator 60, illustrated in the block diagram of FIG. 3, is composed of feed-forward 62, 64 and feedback paths 66, 67, 68, where no additional active summing elements are required. The modulator 60 comprises four integration stages 70, 72, 74, 76 in series, a feedback coefficient ($\alpha$) 78, two feed-forward coefficients ($b_1$, $b_2$) 80, 82, and three summing junctions 84, 86, 88. The feedback path 66 is provided to enhance the noise transfer function by adding a zero in the signal band of the modulator, wherein the output of the fourth integration stage 76 is fed to a negative input of the summing junction 86 via the feedback coefficient ($\alpha$) 78.

The first feedback path 66 connects the output of the fourth integration stage 76 to the summing junction 86 at the input of the third integration stage 74, and includes the feedback coefficient ($\alpha$) 78. The second feedback path 67 connects the output of the modulator 60 to the summing junction 88 at the output of the third integration stage 74, and the third feedback path 68 connects the output of the modulator 60 to the summing junction 84 at the input of the first integration stage 70.

The first feed-forward path 62 connects the output of the first integration stage 70 to the summing junction 88 at the input to the fourth integration stage 76, and includes the first feed-forward coefficient ($b_1$) 80. The second feed-forward path 64 connects the output of the second integration stage 72 to the summing junction 88 at the input to the fourth integration stage, and includes the second feed-forward coefficient ($b_2$) 82.

Figure 4:
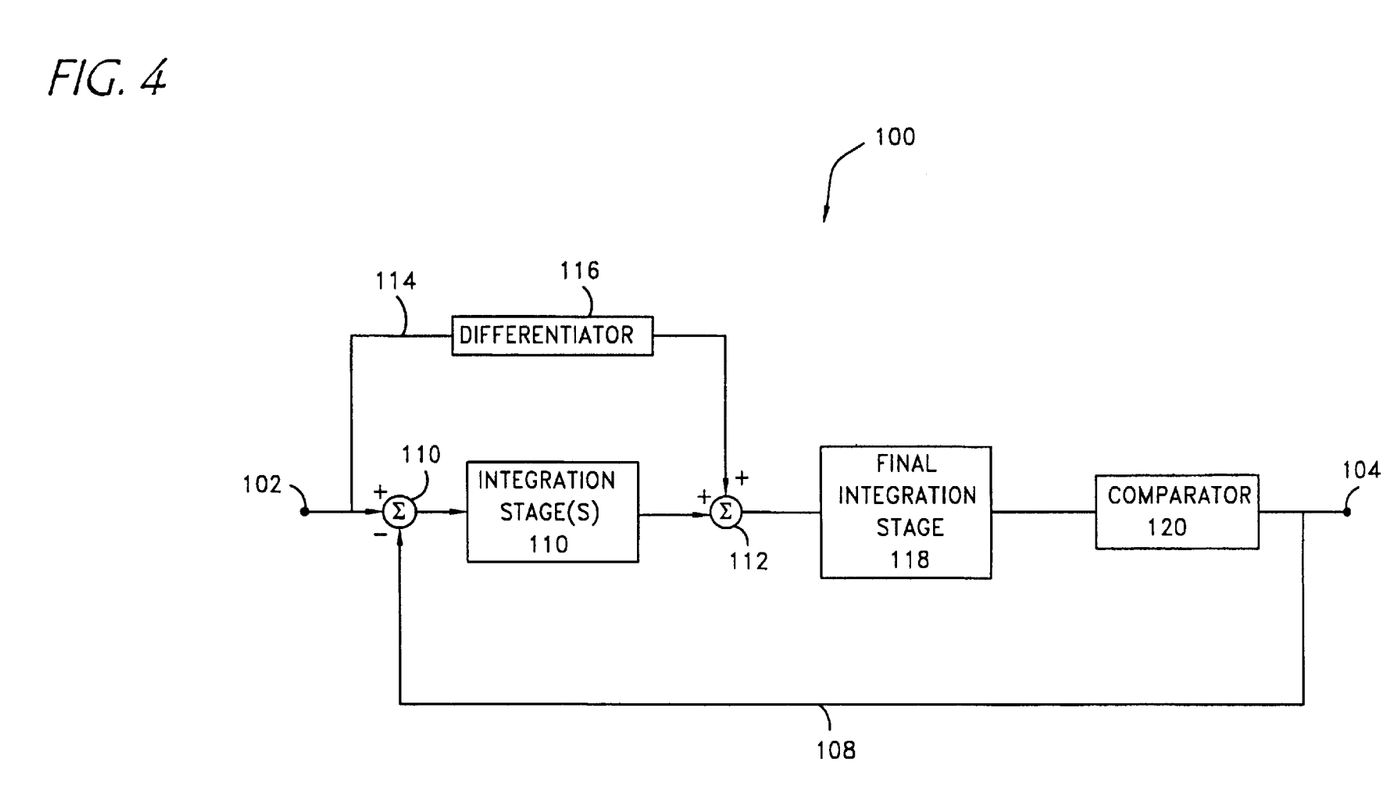
FIG. 4 is a block diagram of one embodiment of the modulator of the present invention.

The modulator 60 has a large input range and low integrator output swings, wherein the swing suppression is achieved by the presence of the feed-forward paths and the minimization of the number of feedback paths. A disadvantage to Coban's modulator, however, is the demanding dedication of state space of the integrators to both signal processing and error processing. Error processing in the integrators is limited by the transmission of the input signal to be processed through the same integrators, resulting in a lower resolution converter. FIG. 4 is a block diagram of one embodiment of a delta-sigma modulator 100 according to the invention. With regard to the circuits illustrated in this Figure and in FIG. 5, it will be appreciated that the construction, functionality and general operation of the integration stages, summing elements, and other functional blocks of a delta sigma modulator are well known to those skilled in the art, therefore a detailed description thereof is omitted.

The modulator 100 comprises a signal input section 102, configured to receive an input signal, and a signal output section 104 configured to provide an output signal. A first summing junction 106 receives the input signal at a positive terminal, and receives the output signal via a feedback path 108 at a negative terminal. The output of the first summing junction 106 is connected to a number of integration stages 110 (illustrated in FIG. 4 as a single entity), and the output of the integration stages 110 is connected to a positive terminal of a second summing junction 112. A feed-forward path 114 is connected to the signal path prior to the first summing junction 106, such that the input signal is differentiated at a differentiator 116 along the feed-forward path 114, and is fed to a positive terminal of the second summing junction 112. The output of the second summing junction is connected to a last, or final integration stage 118, and the output of the final integration stage 118 is coupled to a comparator 120. The output of the comparator 120 is connected to the signal output section, where the output signal is produced. It will be appreciated that a plurality of feedback paths can be implemented in the modulator 100, and the integration stages 110 can comprise a plurality of integrators and feed-forward paths.

The input signal feed-forward path 114 allows the integration stages 110 to dedicate the majority of their operations to error signal processing rather than the processing of both the input signal and an error signal. By including the differentiator 116 in the feed-forward path 114, and connecting the feed-forward path to the signal path prior to the final integration stage 118, the number of integration stages for successful operation can be limited.

Figure 5:
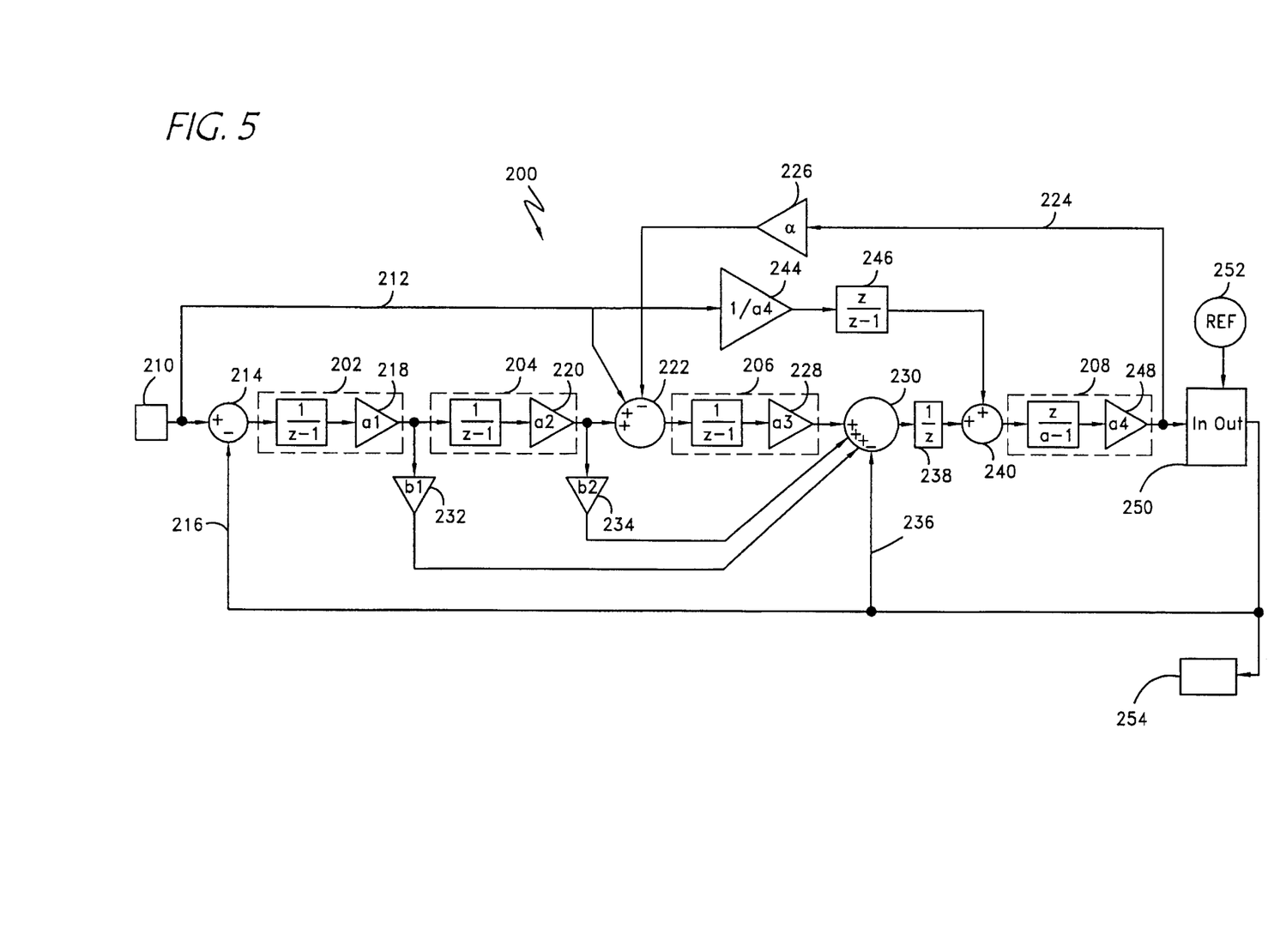
FIG. 5 is a block diagram of one embodiment of the modulator of the present invention.

The block diagram of FIG. 5 illustrates one embodiment of a fourth order, single loop delta-sigma modulator 200. The modulator 200 illustrated in FIG. 5 comprises four integration stages 202, 204, 206, 208 connected in series. An analog signal is received at a signal input section 210 and proceeds to both a first feed-forward path 212, and to a first summing junction 214. The first summing junction 214 receives, in addition to the input signal, a signal from a first feed back path 216 from an output of the modulator 200 at a negative input terminal. The output of the first summing junction 214 is therefore the difference between the input signal and the output signal of the modulator 200.

The signal path from the first summing junction 214 leads to the first integration stage 202 having a gain coefficient "a1" 218. The output of the first integration stage 202 is connected to the second integration stage 204 having a gain coefficient "a2" 220. Following the second integration stage 204, the signal is fed to a second summing junction 222.

The second summing junction 222 receives the modulator input signal from the first feed-forward path 212 at a positive terminal, a signal from the output of the second integration stage 204 at a positive terminal, and the output signal of the fourth integration stage 208 at a negative terminal from a second feedback path 224 through a feedback coefficient ($\alpha$) 226. The output of the second summing junction 222 is coupled to the third integration stage 206, having a gain coefficient a3 228, to a third summing junction 230.

The third summing junction 230 receives a feed-forward signal from the first integration stage 202 through a first feed-forward coefficient b1 232, a feed-forward signal from the second integration stage 204 through a second feed-forward coefficient b2 234, and, at a negative input, the output signal of the modulator 200 along a third feedback path 236. The output of the third summing junction is connected to a delay block 238, which is connected to a fourth summing junction 240. The fourth summing junction 240 receives the input signal from the feed-forward path 212, which includes a gain coefficient (1/a4) 244 and a differentiator 246. The output of the fourth summing junction 240 is connected to the fourth integration stage 208 and a gain coefficient a4 248, and the output of the fourth integration stage 208 is connected to a comparator 250. The comparator 250 compares the signal from the fourth integration stage 208 to a reference signal 252, and the output of the comparator 250 is coupled to an output signal section 254 which provides a digital version of the input signal.

The gain coefficients a1 218, a2 220, a3 228, a4 248, b1 232, and b2 234 can be adjusted to modify the stability, dynamic range, and signal to quantization noise ratio of the modulator. It will be appreciated that additional gain blocks can be removed or added in the feedback, feed-forward, and signal paths to further modify the modulator 200. Also, feed-forward and feedback paths can be added or removed from the modulator, such as the feed-forward paths from the first and second integration stages 202, 204.

The delta sigma modulator 200 embodies a design implementing a method of improved error processing utilizing an input signal feed-forward path. By feeding the input signal to a point along the main signal path ahead of the majority of error processing elements, the majority of error processing elements can be used more efficiently for calculating just signal errors rather than processing both the input signal and an error signal associated with it. The feed-forward path implemented with the delta sigma modulator can therefore improve the accuracy of the circuit. It will be appreciated that the input signal feed-forward design can be used in a number of delta sigma modulator circuits, as well as other systems that perform error processing.

Although the overall circuit architecture is significant to performance, the design of the integrators themselves can have a significant impact on modulator performance as well. In a modulator having multiple integrators, the first integrator is typically the focus of discrete design choice because it typically consumes the most power and produces the most noise in the circuit. Some characteristics which are typically considered when choosing an integrator include settling performance, gain bandwidth product (unity gain bandwidth), slew rate, and dynamic range.

One approach to designing a delta sigma modulator, discussed by Brandt, Ferguson, and Rebeschini in Section 11.4 of "Delta-Sigma Data Converters" (edited by Steven Norsworthy, R. Schreier, and G. C. Temes, IEEE Press, 1997), emphasizes settling time as an important design specification for the integrators of the modulator, and more particularly, the first integrator. According to the section, the two factors that determine settling time in an integrator are the RC time constant and the response and settling of the operational amplifier, wherein the settling of the operational amplifier is determined by the slew rate, unity gain bandwidth, and the configuration in which the amplifier is placed. The article describes the settling time as being either linear or nonlinear. If the process is linear, then the resultant error appears as a gain error in the integrator. However, if the settling process is nonlinear, or signal dependent, the resultant error appears as distortion. According to Brandt, et al., a linear settling error has little effect on the performance of a single-loop modulator, whereas a nonlinear settling error will degrade the performance of both single-loop and cascaded modulators.

Brandt proposes a solution for eliminating the effect of nonlinear settling by ensuring the circuit settles enough (to ensure that the dynamic range requirements are satisfied regardless of signal dependence). However, incomplete settling is typically nonlinear, due to slewing or a delay in response. Thus, the acceptable, linear form of incomplete settling is not the phenomenon commonly observed. In addition, Brandt notes that unity-gain bandwidth can be improved at the expense of output swing, and that for the fastest settling time of the operational amplifier, the integrator gain should be made as small as possible.

An article entitled "Power Optimization of $\Delta\Sigma$ Analog-to-Digital Converters Based on Slewing and Partial Settling Considerations" by Ravindranath Naiknaware and Terri Fiez (IEEE Press, ISCAS, 1998) discloses a technique of obtaining low power modulator designs based on slewing and partial settling behavior of the integrators. Naiknaware, et al., emphasizes slewing behavior and the number of time constants needed to reduce noise distortion as pivotal design specifications for the integrators.

Naiknaware uses a surface plot and a sliced surface plot of modulator performance in terms of signal-to-noise and distortion ratio (SNDR) as a function of slewing and the number of time constants for settling to determine an optimal low power integrator design. A point along the SNDR contour is chosen at a point of minimum power consumption, and sensitivity of the SNDR to slewing and number of time constants at such a point are emphasized as design specifications for the integrator.

In terms of power consumption in a delta-sigma modulator, the integrators are of primary concern. Therefore, component and design specifications for the integrators should be chosen according to specific performance requirements for the modulator. In specific modulator applications, such as audio, a more important integrator specification is dynamic range rather than settling performance. Therefore, designing a modulator by emphasizing the settling performance of an integrator to reduce noise while sacrificing dynamic range, such as the approach proposed by Brandt, can compromise the performance of the modulator. In addition, dynamic range is not considered with appropriate emphasis in Naiknaware's method of designing a low power modulator.

Relaxed requirements for incomplete settling of integrators can significantly reduce power consumption of delta sigma modulators. However, the reduction in power consumption can be achieved without compromising dynamic range of the modulator, which is of particular significance for high order delta sigma modulators, such as the modulator 200, but can be effective for first and second order modulators as well.

In the process of optimizing low power performance of a modulator, the reduction of slew rate and gain bandwidth requirements on each integrator of the modulator can be carefully considered. The location of each integrator, as well as the overall structure and dimensioning of the modulator, directly effect the degree to which the integrator characteristics can be relaxed. In the event the slew rate and gain bandwidth performance requirements are excessively relaxed, the performance of the modulator, in terms of signal-to-noise ratio (SNR) and dynamic range will degrade sharply in the presence of jitter.

Thus, integrator characteristics can be defined for designing a low power modulator wherein dynamic range is not compromised. A significant characteristic for emphasis in integrator design is the gain bandwidth product. Gain bandwidth product can be related to the sampling frequency and desired resolution of a modulator to define advantageous design characteristics for the modulator.

Relaxing the criteria for complete settling is a primary source of reduced power consumption in one modulator embodiment of the present invention. Conventionally, integrators were constructed such that the gain bandwidth product of the integrator was large enough that the integrator output would settle to well within the converter resolution within about half a sampling period. Thus, the higher the converter resolution, the more integrator time constants must be present between sampling times. This requirement may be expressed with the following equation, where 'α' is the number of time constants for acceptable settling and 'n' is the resolution of the converter:

$$e^{-\alpha} \leq 2^{-n} \quad (1)$$

Equation (1) can be rearranged to express the number of time constants (α) as a function of converter resolution (n).

$$\alpha \geq n \cdot \ln 2 \quad (2)$$

An integrator time constant (τ) can be expressed as a function of gain bandwidth product (GBW) as follows:

$$\tau = \frac{1}{2\pi \cdot GBW} \quad (3)$$

In addition, as the settling should take place in half of a sampling period, which is a commonly accepted requirement in most modulators, the number (α) of time constants (τ) can be related to the sampling frequency ($f_s$).

$$\alpha \cdot \tau = \frac{1}{2 \cdot f_s} \quad (4)$$

Combining equations (2), (3), and (4), the conventional condition for gain bandwidth product in terms of converter resolution and sampling frequency is defined as follows:

$$GBW \geq \frac{n \cdot \ln 2 \cdot f_s}{\pi} \quad (5)$$

By rearranging equation (5), a ratio can be defined between gain bandwidth and sampling frequency, in terms of converter resolution:

$$\frac{GBW}{f_s} \geq \frac{n \cdot \ln 2}{\pi} \quad (6)$$

$$\frac{GBW}{f_s} \geq 0.22 \ n \quad (7)$$

Equation (7) uses an approximate value for (ln 2)/π. The ratio of equation (7) can therefore be used to design a data converter for audio applications, such as the hearing aids and cellular telephones previously discussed, where reduced power consumption would be beneficial. For example, in a converter using a sampling frequency $f_s$=1.28 MHz and 16-bit resolution (n=16), Equation (5) would yield a gain bandwidth product GBW>4.51 MHz. Thus, conventional converters for this application have been designed to have a GBW of 5 MHz and above. It has been found, however, that incorporating a modulator with a gain bandwidth product less than this formula into an audio communication product, produces a circuit with optimal characteristics in terms of the trade off between power consumption and performance results.

Figure 6:
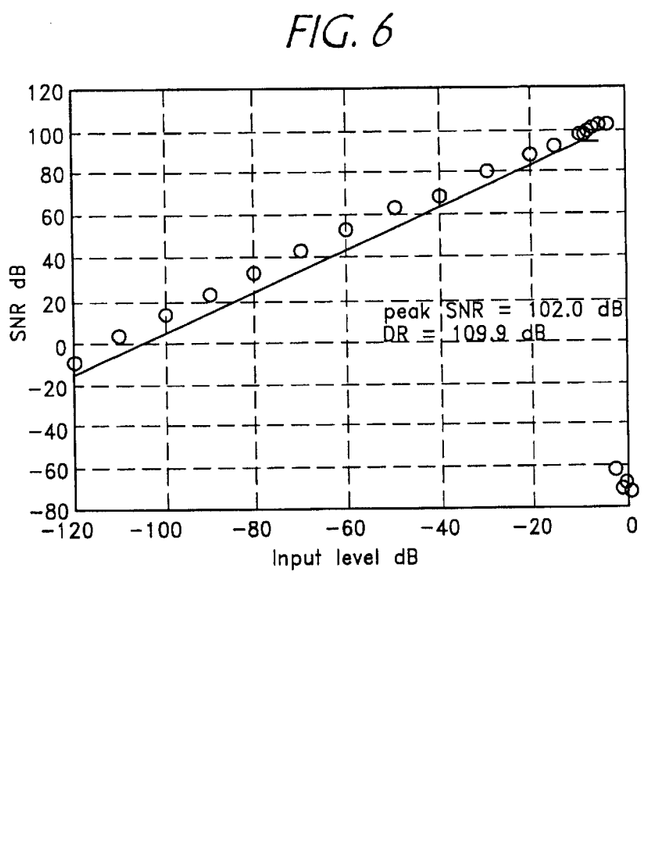
FIG. 6 is a graphical illustration of SNR as a function of input signal level for an ideal data converter.
Figure 7:
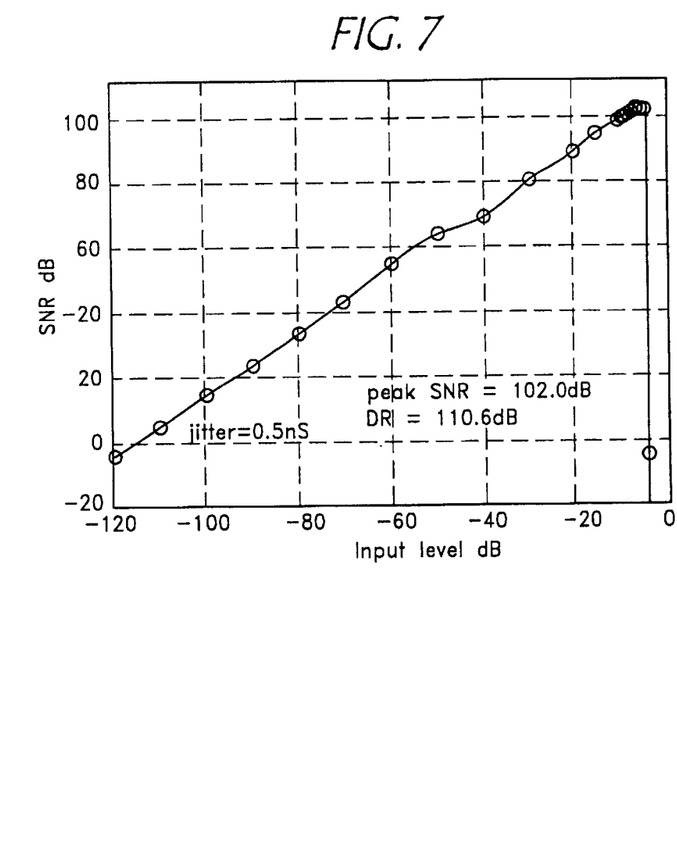
FIG. 7 is a graphical illustration of SNR as a function of input signal level for a data converter having a gain bandwidth product of 3 MHz in the presence of jitter.

FIG. 6 is a graphical illustration of SNR as a function of input signal level for an ideal 16 bit converter using a sampling frequency of 1.28 MHz, and FIG. 7 is the actual performance of a 16 bit modulator with a GBW of 3 MHz for each integrator (A1–A4), and a sampling frequency of 1.28 MHz in the presence of a jitter of 500 $ps_{RMS}$. As can be seen in FIGS. 6 and 7, for ideal modulator operation, the peak SNR is 102 dB with a DR of about 110 dB, and the actual performance of a modulator with a 3 MHz GBW for all integrators (A1–A4) has a peak SNR of 102 dB and a dynamic range of 110 dB. Thus, reducing the GBW below the 4.51 MHz threshold given by equation (7) can still yield an acceptable SNR without compromising dynamic range of the modulator.

Figure 8:
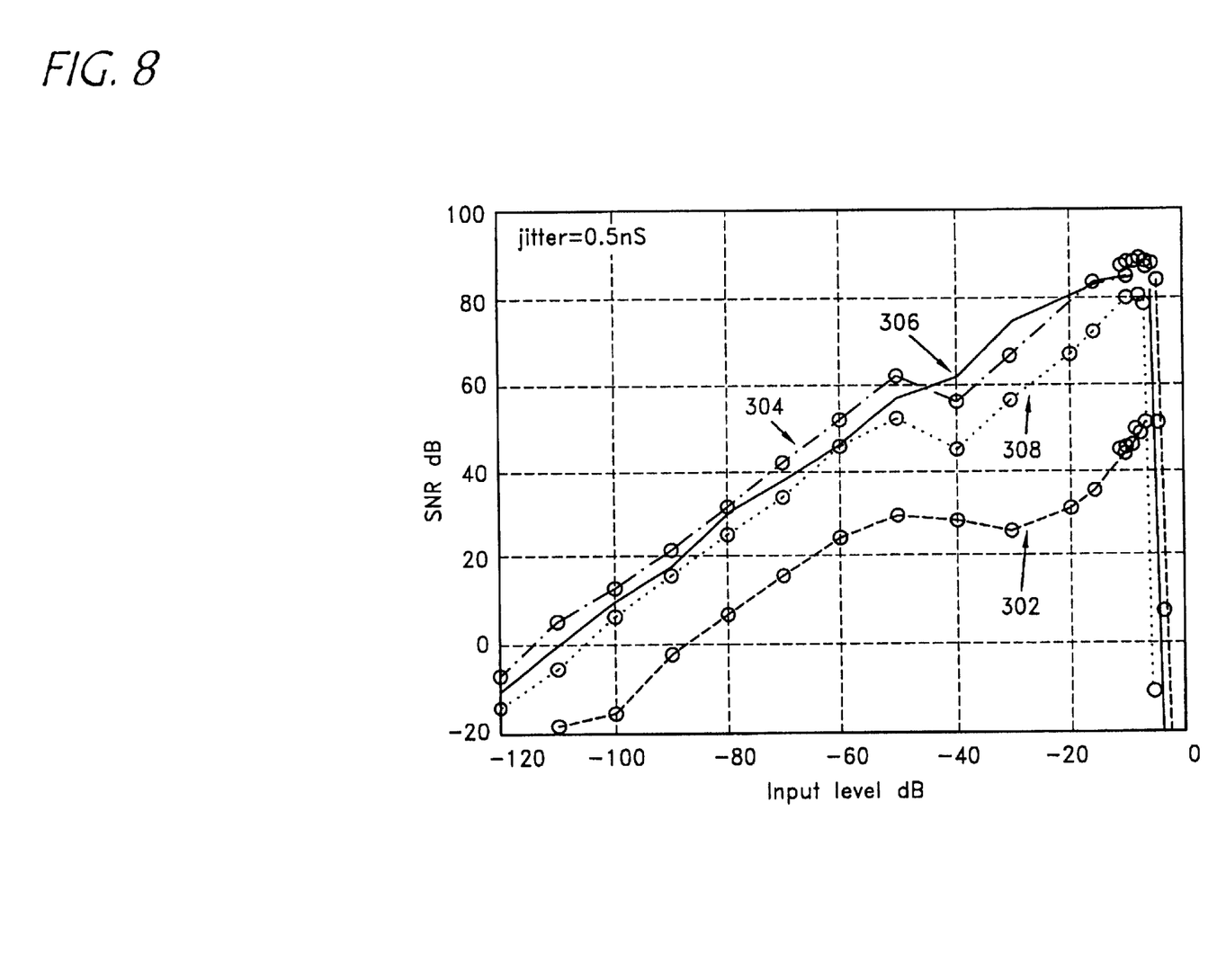
FIG. 8 is a graphical illustration of SNR as a function of input signal level for a data converter having a gain bandwidth product of 0.5 MHz in the presence of jitter.

Reducing the settling performance requirement too much, however, can result in large reductions in both SNR and DR in the presence of jitter. FIG. 8 is a graphical illustration of SNR as a function of input signal level for a 16 bit modulator using a 1.28 MHz sampling frequency in the presence of jitter. For each of the traces in FIG. 8, the GBW of one of the integrators (A1–A4) is reduced from 3 MHz to 0.5 MHz, while the GBW of the other three integrators remains at the 3 MHz level. Trace 302 corresponds to the performance of the modulator where integrator A1 has a GBW of 0.5 MHz, trace 304 corresponds to the performance of the modulator where integrator A2 has a GBW of 0.5 MHz, trace 306 corresponds to the performance of the modulator where integrator A3 has a GBW of 0.5 MHz, and trace 308 corresponds to the performance of the modulator where integrator A4 has a GBW of 0.5 MHz. As can be seen from the graph, the performance of the modulator is greatly degraded from the ideal performance illustrated in FIG. 6. Thus, a lower limit of about 0.5 MHz for GBW can be defined at which performance is unsuitable for audio applications.

Criteria can therefore be determined for acceptable converter performance in terms of integrator specifications using the performance of the modulators of FIGS. 3 and 5. An acceptable range for the ratio of GBW to the sampling frequency of a modulator with a resolution 'n' would therefore be between about 0.04 n and about 0.25 n. It will be appreciated that the numerical values "0.04" and "0.25" are approximate and should be interpreted as such.

As shown in FIG. 7, a modulator having a GBW of 3 MHz, a sampling frequency of 1.28 MHz, and a resolution of 16 bits, exhibits acceptable SNR and DR characteristics, even though the ratio of GBW to sampling frequency is 2.34, which is below that suggested by equation (7), the criteria of the prior art. Thus, according to one embodiment of the invention, a modulator satisfying the characteristics defined above with respect to the ratio of GBW to the sampling frequency of a modulator with a resolution 'n' will have reduced power consumption while maintaining acceptable dynamic range and SNR.

Incorporating the design techniques and specifications presented above benefits power conservation in the hearing aids and audio circuits having data converters, such as those illustrated in FIGS. 1–2. Battery life is thereby extended by reducing power dissipation in such devices.

The foregoing description details certain embodiments of the invention. It will be appreciated, however, that no matter how detailed the foregoing appears in text, the invention can be practiced in many ways. As is also stated above, it should be noted that the use of particular terminology when describing certain features or aspects of the invention should not be taken to imply that the terminology is being re-defined herein to be restricted to including any specific characteristics of the features or aspects of the invention with which that terminology is associated. The scope of the invention should therefore be construed in accordance with the appended claims and any equivalents thereof.

What is claimed is:

1. A delta-sigma modulator employing a single loop, fourth order architecture, comprising:
    an input signal section;
    an output signal section;
    four integration stages connected in a cascaded configuration and having a signal path;
    at least one feedback path from said output signal section; and
    a feed-forward path comprising a differentiator, connected to said input signal section and to said signal path prior to a fourth integration stage.

2. The delta-sigma modulator of claim 1, wherein said feed-forward path is also connected to said signal path prior to the third integration stage.

3. The delta-sigma modulator of claim 1, wherein the delta-sigma modulator has a resolution and wherein at least one of said integration stages has a ratio of gain bandwidth product to sampling frequency of less than about 0.2 times said resolution.

4. A method of improving error processing in a fourth order delta-sigma modulator having four integration stages, comprising connecting an input signal feed-forward path to the signal path prior to a fourth integration stage, and differentiating an input signal along said feed-forward path.

5. A circuit for improving error processing in a fourth order delta-sigma modulator, wherein said modulator has four integration stages, comprising a feed-forward path from an input of said delta-sigma modulator connected to the signal path prior to a fourth integration stage, wherein said feed-forward path includes a differentiator.

6. The circuit of claim 5, wherein said modulator comprises a single loop architecture.

7. The circuit of claim 5, wherein said modulator has resolution and wherein at least one of said integration stages has a ratio of gain bandwidth product to sampling frequency of less than about 0.2 times said resolution.

8. A fourth order delta-sigma modulator, for use in an analog to digital converter, comprising:
    an input signal section;
    an output signal section;
    a plurality of integration stages connected in a cascaded configuration; and
    a feed-forward path coupled to said input signal section and connected to the signal path prior to a last of said plurality of integration stages, comprising a differentiator.

9. The delta-sigma modulator of claim 8, wherein the modulator has a single loop architecture.

10. A hearing aid comprising a fourth order delta-sigma modulator, wherein said modulator has a feed-forward path from an input signal section connected to the signal path prior to a final integration stage, wherein the feed-forward path includes a differentiator.

11. The hearing aid of claim 10, wherein the modulator has a single loop architecture.

12. The hearing aid of claim 10, wherein the modulator has a resolution and a plurality of integration stages, and wherein at least one of said integration stages has a ratio of gain bandwidth product to sampling frequency of less than about 0.2 times said resolution.

13. An audio circuit, comprising a fourth order delta sigma modulator having a feed-forward path connected from an input signal section to the signal path prior to a final integration stage, wherein the feed-forward path includes a differentiator.

14. The audio circuit of claim 13, wherein the modulator has a single loop architecture.

15. The audio circuit of claim 13, wherein the modulator has a plurality of integrators and a resolution, and wherein at least one of said integrators has a ratio of gain bandwidth product to sampling frequency of less than about 0.2 times said resolution.

16. A delta-sigma modulator, comprising:
    an input signal section;
    an output signal section;
    four integration stages connected in series, each having an input and an output;
    a first feedback path having a first end connected to the output of the fourth integration stage and a second end connected to the input of the third integration stage;
    a second feedback path having a first end connected to the output signal section and a second end connected to the input signal section;
    a third feedback path having a first end connected to the output signal section and a second end connected to the input of the fourth integration stage;
    a first feed-forward path having a first end connected to the output of the first integration stage and a second end connected to the input of the fourth integration stage;
    a second feed-forward path having a first end connected to the output of the second integration stage and a second end connected to the input of the fourth integration stage; and
    a third feed-forward path having a first end connected to the input signal section and a second end connected to the input of the fourth integration stage, wherein the third feed-forward path includes a differentiator.

17. The modulator of claim 16, further comprising a fourth feed-forward path having a first end connected to the input signal section and a second end connected to the input of the third integration stage.

18. A delta-sigma modulator, comprising:

an input signal section;

an output signal section;

four integration stages connected in a cascaded configuration and having a signal path, wherein at least one of said integration stages has a ratio of gain bandwidth product to sampling frequency of less than about 0.2 times a resolution of the modulator;

at least one feedback path from said output signal section; and a feed-forward path comprising a differentiator, connected to said input signal section and to said signal path prior to a fourth integration stage.

19. The delta-sigma modulator of claim 18, wherein said ratio of gain bandwidth product to sampling frequency is greater than about 0.04 times said resolution.

20. A method of reducing power consumption and improving error processing in an audio communication product having a delta-sigma modulator with a plurality of integrators, comprising reducing a ratio of gain bandwidth product to sampling frequency of the at least one integrator to below about 0.2 times a resolution of the data converter, connecting an input signal feed-forward path to the signal path prior to a fourth integration stage, and differentiating an input signal along said feed-forward path.

* * * * *